US012327590B2

(12) United States Patent
Best

(10) Patent No.: US 12,327,590 B2
(45) Date of Patent: *Jun. 10, 2025

(54) HYBRID VOLATILE AND NON-VOLATILE MEMORY DEVICE

(71) Applicant: Rambus Inc., Sunnyvale, CA (US)

(72) Inventor: Scott C. Best, Palo Alto, CA (US)

(73) Assignee: Rambus Inc., San Jose, CA (US)

( * ) Notice: Subject to any disclaimer, the term of this patent is extended or adjusted under 35 U.S.C. 154(b) by 945 days.

This patent is subject to a terminal disclaimer.

(21) Appl. No.: 15/898,041

(22) Filed: Feb. 15, 2018

(65) Prior Publication Data

US 2018/0240520 A1  Aug. 23, 2018

Related U.S. Application Data

(63) Continuation of application No. 14/697,182, filed on Apr. 27, 2015, now Pat. No. 9,905,297, which is a (Continued)

(51) Int. Cl.
*G11C 14/00* (2006.01)
*G06F 12/02* (2006.01)
*G06F 12/06* (2006.01)
*G06F 13/16* (2006.01)
*G11C 7/10* (2006.01)
(Continued)

(52) U.S. Cl.
CPC ...... *G11C 14/0018* (2013.01); *G06F 12/0246* (2013.01); *G06F 12/0638* (2013.01); *G06F 13/1694* (2013.01); *G11C 7/10* (2013.01); *G11C 7/22* (2013.01); *G11C 11/005* (2013.01); *G11C 11/4093* (2013.01); *G11C 7/1048* (2013.01); *G11C 7/1057* (2013.01);
(Continued)

(58) Field of Classification Search
CPC ............ G11C 14/0018; G11C 14/0009; G11C 14/0063; G11C 14/0054; G11C 7/10; G11C 7/22; G11C 11/005; G11C 11/4093; G11C 7/1048; G11C 7/1057; G11C 7/1084; G11C 7/1096; G11C 2207/2236; G06F 12/0638; G06F 12/0246; G06F 13/1694
USPC .......................................... 365/189.2, 230.06
See application file for complete search history.

(56) References Cited

U.S. PATENT DOCUMENTS 5,043,946 A * 8/1991 Yamauchi ............. G11C 11/404
365/185.32
5,363,500 A    11/1994 Takeda
(Continued)

FOREIGN PATENT DOCUMENTS

JP    2006-032379    2/2006

OTHER PUBLICATIONS

PCT International Preliminary Report on Patentability dated Oct. 29, 2009 (Chapter 1) in International Application No. PCT/US2008/060566. 11 pages.

*Primary Examiner* — Michael T Tran
(74) *Attorney, Agent, or Firm* — Lance Kreisman; Peninsula Patent Group

(57) ABSTRACT

A method of controlling a memory device is disclosed. The method includes receiving an address value that indicates a range of addresses within the memory device, each address within the range of addresses corresponding to storage locations within each of two distinct storage dice within the memory device. The address value is stored within a programmable register within the memory device.

17 Claims, 2 Drawing Sheets

Related U.S. Application Data continuation of application No. 14/458,212, filed on Aug. 12, 2014, now Pat. No. 9,047,942, which is a continuation of application No. 13/867,963, filed on Apr. 22, 2013, now Pat. No. 8,837,236, which is a continuation of application No. 12/596,115, filed as application No. PCT/US2008/060566 on Apr. 17, 2008, now Pat. No. 8,427,891.

(60) Provisional application No. 60/912,321, filed on Apr. 17, 2007.

(51) Int. Cl.
 *G11C 7/22* (2006.01)
 *G11C 11/00* (2006.01)
 *G11C 11/4093* (2006.01)

(52) U.S. Cl.
 CPC .......... *G11C 7/1084* (2013.01); *G11C 7/1096* (2013.01); *G11C 2207/2236* (2013.01)

(56) References Cited

U.S. PATENT DOCUMENTS

| | | | | |
|---|---|---|---|---|
| 5,399,516 | A * | 3/1995 | Bergendahl | H01L 27/1052 438/242 |
| 5,619,470 | A * | 4/1997 | Fukumoto | G11C 14/00 365/194 |
| 5,909,703 | A * | 6/1999 | Hansen | G06F 12/0623 711/167 |
| 5,966,736 | A * | 10/1999 | Gittinger | G06F 13/1694 711/149 |
| 6,016,256 | A * | 1/2000 | Crane, Jr. | H01L 23/5385 361/813 |
| 6,016,537 | A * | 1/2000 | Hansen | G06F 12/06 711/217 |
| 6,043,109 | A * | 3/2000 | Yang | H01L 24/94 438/109 |
| 6,057,598 | A * | 5/2000 | Payne | H01L 23/49575 257/723 |
| 6,150,724 | A * | 11/2000 | Wenzel | H01L 25/0657 257/777 |
| 6,204,562 | B1 * | 3/2001 | Ho | H01L 24/13 257/E23.021 |
| 6,480,929 | B1 * | 11/2002 | Gauthier | G06F 13/1694 710/313 |
| 6,741,486 | B2 | 5/2004 | Sakui | |
| 6,847,575 | B2 | 1/2005 | Ayukawa et al. | |
| 7,406,572 | B1 * | 7/2008 | Nguyen | G11C 7/1045 711/107 |
| 7,449,744 | B1 * | 11/2008 | Yu | H01L 29/7881 438/293 |
| 7,710,758 | B2 | 5/2010 | Jo | |
| 7,716,411 | B2 | 5/2010 | Panabaker et al. | |
| 7,764,081 | B1 * | 7/2010 | Tuan | H03K 19/007 326/14 |
| 7,873,430 | B1 * | 1/2011 | Sprecher | G06Q 10/06 700/100 |
| 8,233,303 | B2 | 7/2012 | Best et al. | |
| 8,427,891 | B2 * | 4/2013 | Best | G06F 12/0638 365/189.2 |
| 8,516,525 | B1 * | 8/2013 | Jerding | H04N 21/4821 709/219 |
| 8,789,013 | B1 * | 7/2014 | Lloyd | G06F 9/542 717/121 |
| 8,837,236 | B2 | 9/2014 | Best | |
| 9,047,942 | B2 | 6/2015 | Best | |
| 9,652,379 | B1 * | 5/2017 | Syu | G06F 12/0246 |
| 9,747,200 | B1 * | 8/2017 | Micheloni | G06F 12/0246 |
| 9,905,297 | B2 * | 2/2018 | Best | G06F 12/0638 |
| 9,947,401 | B1 * | 4/2018 | Navon | G06F 11/3034 |
| 2001/0030890 | A1 * | 10/2001 | Yamagami | G11C 29/765 365/185.09 |
| 2002/0172074 | A1 | 11/2002 | Hsu et al. | |
| 2002/0185337 | A1 * | 12/2002 | Miura | G11C 11/40603 185/11 |
| 2002/0199056 | A1 * | 12/2002 | Ayukawa | G11C 11/4087 711/167 |
| 2003/0206478 | A1 * | 11/2003 | Ayukawa | G11C 11/4076 365/230.03 |
| 2003/0229831 | A1 * | 12/2003 | Jeon | G11C 7/1045 714/718 |
| 2004/0008764 | A1 | 1/2004 | Seo et al. | |
| 2004/0047228 | A1 * | 3/2004 | Chen | G11C 11/40615 365/232 |
| 2004/0145387 | A1 | 7/2004 | Yun et al. | |
| 2005/0041470 | A1 * | 2/2005 | Inoue | H01L 27/112 257/E27.103 |
| 2005/0105316 | A1 * | 5/2005 | Okuno | G11C 29/802 365/51 |
| 2005/0169061 | A1 * | 8/2005 | Sohn | G11C 8/10 365/189.03 |
| 2005/0210302 | A1 * | 9/2005 | Kato | G06Q 20/327 713/320 |
| 2005/0289428 | A1 * | 12/2005 | Ong | G01R 31/31905 714/742 |
| 2006/0065963 | A1 * | 3/2006 | Low | H01L 23/3128 438/109 |
| 2006/0076690 | A1 * | 4/2006 | Khandros | H01L 24/49 257/777 |
| 2006/0140203 | A1 * | 6/2006 | Jain | H04L 49/90 370/412 |
| 2006/0157866 | A1 * | 7/2006 | Le | H01L 25/0657 257/E21.705 |
| 2006/0184716 | A1 * | 8/2006 | Hsieh | G11C 7/1042 711/103 |
| 2006/0224789 | A1 * | 10/2006 | Cho | G11C 7/1039 710/52 |
| 2006/0239097 | A1 * | 10/2006 | Nakai | G11C 13/0004 365/222 |
| 2006/0294295 | A1 * | 12/2006 | Fukuzo | G06F 13/1673 711/105 |
| 2007/0014168 | A1 * | 1/2007 | Rajan | G11C 29/24 365/201 |
| 2007/0047362 | A1 * | 3/2007 | Kuwabara | G06F 13/1636 365/63 |
| 2007/0091678 | A1 * | 4/2007 | Kato | G11C 16/32 365/185.09 |
| 2007/0096265 | A1 * | 5/2007 | Wallace | H01L 23/49537 257/E25.013 |
| 2007/0278697 | A1 * | 12/2007 | Kuroda | H01L 23/3128 257/777 |
| 2008/0010418 | A1 * | 1/2008 | Kao | G06F 13/1673 711/103 |
| 2008/0010420 | A1 * | 1/2008 | Kao | G06F 13/16 711/154 |
| 2008/0046638 | A1 * | 2/2008 | Maheshwari | G06F 12/0638 711/E12.083 |
| 2008/0084725 | A1 * | 4/2008 | Lahtinen | G11C 5/02 713/1 |
| 2008/0098277 | A1 * | 4/2008 | Hazelzet | H03M 13/19 714/753 |
| 2008/0122478 | A1 * | 5/2008 | Mei | G11C 7/04 323/272 |
| 2008/0123305 | A1 * | 5/2008 | Amidi | H05K 1/181 361/737 |
| 2008/0143379 | A1 * | 6/2008 | Norman | H01L 23/5382 326/39 |
| 2008/0147940 | A1 * | 6/2008 | Kao | G06F 13/1694 710/107 |
| 2008/0157350 | A1 * | 7/2008 | Cheah | G06F 1/183 257/713 |
| 2008/0209106 | A1 * | 8/2008 | Bennett | G11C 16/08 711/E12.001 |
| 2010/0091537 | A1 | 4/2010 | Best et al. | |
| 2010/0115191 | A1 | 5/2010 | Hampel et al. | |
| 2010/0164124 | A1 * | 7/2010 | Du | H01L 25/50 257/777 |

(56) References Cited

U.S. PATENT DOCUMENTS

| | | | |
|---|---|---|---|
| 2011/0079923 A1* | 4/2011 | Suh | G11C 5/02 700/121 |
| 2011/0202690 A1* | 8/2011 | Chu | G06F 3/0601 710/63 |
| 2011/0254112 A1* | 10/2011 | Yamanaka | H01L 43/12 257/421 |
| 2012/0215958 A1* | 8/2012 | Fai | G11C 7/1057 710/316 |
| 2013/0148401 A1* | 6/2013 | Fai | H01L 23/552 257/E21.705 |
| 2013/0320197 A1* | 12/2013 | Asayama | H04N 5/379 250/208.1 |
| 2015/0261461 A1* | 9/2015 | Li | G06F 3/0656 711/135 |
| 2015/0325560 A1* | 11/2015 | Fai | H01L 23/5283 438/109 |
| 2017/0257121 A1* | 9/2017 | Kwok | H03M 13/1108 |
| 2018/0005670 A1* | 1/2018 | Lee | G11C 5/04 |
| 2018/0102344 A1* | 4/2018 | Ramachandra | G11C 7/22 |
| 2019/0179785 A1* | 6/2019 | Keeth | G06F 3/0659 |
| 2019/0188162 A1* | 6/2019 | Kwon | G06F 12/0246 |
| 2019/0259447 A1* | 8/2019 | Shaeffer | G11C 11/4096 |
| 2020/0004670 A1* | 1/2020 | Williams | G11C 16/0483 |
| 2020/0286536 A1* | 9/2020 | Fukami | G11C 11/161 |
| 2021/0280558 A1* | 9/2021 | Guo | H01L 23/3128 |
| 2021/0313988 A1* | 10/2021 | Weber | H03K 19/17768 |
| 2021/0391303 A1* | 12/2021 | Lung | H01L 25/0657 |
| 2022/0083252 A1* | 3/2022 | Eno | G06F 11/1417 |
| 2022/0093570 A1* | 3/2022 | Mansor | H01L 23/13 |
| 2022/0208295 A1* | 6/2022 | Chueh | G11C 29/76 |
| 2024/0371419 A1* | 11/2024 | Lee | G11C 7/1048 |
| 2024/0403241 A1* | 12/2024 | Li | G06F 13/1673 |
| 2024/0411690 A1* | 12/2024 | Liu | G06F 12/0292 |
| 2024/0420761 A1* | 12/2024 | Guedj | G11C 13/004 |
| 2025/0036292 A1* | 1/2025 | Lee | G06F 3/064 |
| 2025/0044945 A1* | 2/2025 | Jha | G06F 12/0802 |

* cited by examiner

HYBRID VOLATILE AND NON-VOLATILE MEMORY DEVICE

RELATED APPLICATIONS

The present application is a continuation of U.S. Ser. No. 14/697,182, filed Apr. 27, 2015, entitled "Hybrid Volatile and Non-Volatile Memory Device", by inventor Scott C. Best, which is a continuation of U.S. Ser. No. 14/458,212, filed Aug. 12, 2014, entitled "Hybrid Volatile and Non-Volatile Memory Device", by inventor Scott C. Best, now U.S. Pat. No. 9,047,942, which is a continuation of U.S. Ser. No. 13/867,963, filed Apr. 22, 2013, entitled "Hybrid Nonvolatile Shadowed DRAM with an Overlapping Region Between a Volatile Storage Die and a Nonvolatile Storage Die", by inventor Scott C. Best, now U.S. Pat. No. 8,837,236, which is a continuation of U.S. Ser. No. 12/596,115, filed Oct. 15, 2009, entitled "Hybrid Volatile and Non-Volatile Memory", by inventor Scott C. Best, issuing as U.S. Pat. No. 8,427,891 on Apr. 23, 2013, which claims priority under 35 U.S.C § 120 to International Application No. PCT/US08/60566, filed on Apr. 17, 2008, which further claims priority under 35 U.S.C. § 119 to U.S. Provisional Patent Application No. 60/912,321, filed Apr. 17, 2007, each of which is incorporated herein by reference in its entirety.

TECHNICAL FIELD

The disclosure herein relates to data processing and more particularly to data storage devices.

BACKGROUND

Many modern data processing systems include both volatile DRAM (dynamic random access memory) for mass storage and non-volatile Flash memory for power-down data retention. Due to process incompatibilities, however, the DRAM and Flash are typically implemented in separate integrated circuit devices having distinct control and data interfaces and disposed in distinct regions of an integrated circuit board. With regard to the individual memory characteristics, the need to regenerate and reload data into the DRAM device at boot-up (or wake-up) delays system readiness, and Flash memory devices suffer from relatively slow access times and write-limiting degradation. If DRAMs were non-volatile, computers, cell phones and other electronic systems could start up and wake up more quickly, and if Flash memory was faster and did not wear out, it could be used as a device's mass storage.

BRIEF DESCRIPTION OF THE DRAWINGS

The disclosure herein is illustrated by way of example, and not by way of limitation, in the figures of the accompanying drawings and in which like reference numerals refer to similar elements and in which.

DETAILED DESCRIPTION

A hybrid, composite memory device having non-volatile and volatile memories implemented in distinct integrated circuit (IC) dice that are packaged together and accessed through a shared interface is disclosed in various embodiments. By fabricating the non-volatile and volatile memories in separate ICs, processes that have developed for optimizing the performance of each die may be followed, avoiding the compromises typically required to merge the different storage technologies in a common process. Also, because a shared interface is provided, the memory control function and interface of the system may be simplified. Additionally, through provision of additional control circuitry within the volatile memory IC, non-volatile memory IC or separate control IC, some or all of the volatile memory may be shadowed by the non-volatile memory, synergistically providing the benefits of both memory types. For example, in one application of the hybrid memory device, a DRAM memory is provided for relatively high-speed memory access and degradation-free performance, with systematic write-back from the DRAM to a Flash memory to provide a non-volatile image of the DRAM contents which may be quickly restored from the Flash memory to the DRAM for rapid device boot-up and wake-up. In effect, the hybrid memory device functions as a non-volatile DRAM, having the fast-access and degradation-free performance of a DRAM and the non-volatile characteristics of a Flash memory.

Hybrid Memory Architecture (HMA)

Figure 1A:
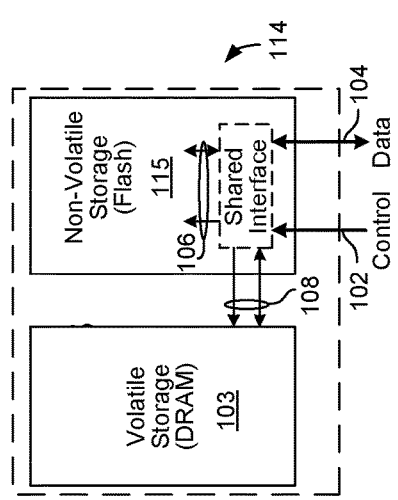
FIG. 1A illustrates an embodiment of a hybrid, composite memory device having a non-volatile storage IC, volatile storage IC and shared-interface IC.

FIG. 1A illustrates an embodiment of a hybrid, composite memory device 100 having a non-volatile storage IC 101, volatile storage IC 103 and shared-interface IC 105. More specifically, in the embodiment shown and other embodiments disclosed herein, the non-volatile storage IC 101 (also referred to herein as a non-volatile memory die) is implemented by a Flash memory die (non-volatile storage based on block-erased floating-gate metal-oxide-semiconductor memory) of either the NAND-Flash or NOR-Flash varieties, though any other electrically-erasable or electrically-alterable storage technology may alternatively be used. Similarly, the volatile storage IC 103 (also referred to herein as a volatile memory die) is implemented by a DRAM die (single transistor, single capacitor storage cell), though static random access memory (SRAM), reduced-transistor DRAM or any other type of volatile storage technology may be used in alternatives to the embodiments of FIG. 1A and other Figures described below.

As shown, the shared interface 105 includes a uni-directional control interface 102 (or request interface or command interface) to receive commands from a controller device (not shown in FIG. 1A), and a bi-directional data interface 104 to receive data from and output data to the controller device. In one embodiment, the control and data interfaces are implemented in a manner that corresponds to standard synchronous or asynchronous non-volatile memory devices. For example, as shown at 110, the control interface may present a conventional synchronous or asynchronous DRAM interface to the memory controller, and thus receive read-address-strobe (RAS), column-address-strobe (RAS), write-enable (WE) and output-enable (OE) signals from the memory controller along with clock and clock-enable signals (not specifically shown). Alternatively, the control interface 102 may receive read-enable and write-enable signals (REN, WEN as shown at 112) as in a flash memory or SRAM implementation. Also, the control interface 102 may additionally include dedicated address lines to receive memory read and write addresses from the memory controller, or the address information may be time-multiplexed onto the control lines or data lines. The data lines and/or control lines may be accompanied by source-synchronous timing signals such as strobe or clock signals that transition in a desired phase alignment with respect to valid-signal windows (data eyes) in the data and control signals and thus may be used to precisely control the sampling of those signals within the shared interface 105.

Internally, the shared interface 105 includes circuitry to forward control and data signals to the appropriate memory die, converting signals from the external data access protocol to an internal data access protocol as necessary. For example, in an embodiment having a DRAM external interface, control and data signals may be forwarded without change to a DRAM die (or with data serialization or deserialization to compensate for differences in path width between the internal and external data and/or control paths), but may be converted from DRAM format to Flash memory format before being forwarded to the Flash memory device. In general, any external protocol may be used to access the hybrid memory device, and any internal protocol or set of protocols may be used to control the volatile and non-volatile storage dice. Further, while only two storage dice are shown, multiple non-volatile storage dice and/or multiple volatile storage dice may be provided and selected by the shared interface circuitry based on incoming address and/or control signals. In such instances, the multiple volatile storage dice may be identical, or may be different in various regards, including storage capacity, storage technology (e.g., one or more SRAM dice may be packaged with one or more DRAM device), and/or the multiple non-volatile storage dice may be identical or mixed as where a Flash memory device is packaged with one or more ROM devices to form a system in package.

Figure 1B:
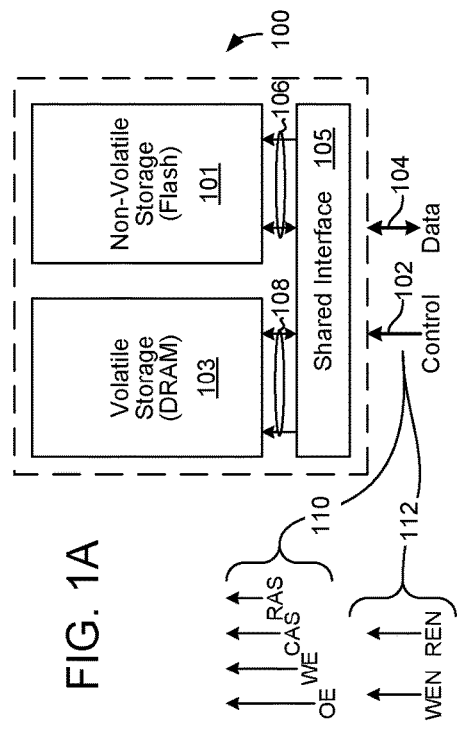
FIG. 1B illustrates an alternative hybrid memory device embodiment in which the shared interface circuitry is implemented in the non-volatile storage device.

FIG. 1B illustrates an alternative hybrid memory device embodiment 114 in which the shared interface circuitry is implemented in a non-volatile storage device 115. That is, rather than providing a dedicated die (e.g., an application-specific IC (ASIC) or the like) to carry out the shared interface functions, the shared-interface circuitry is fabricated within an area of the non-volatile storage device 115 and thus forwards on-die control signals 106 to the non-volatile core (after performing any necessary protocol conversion), and forwards control and data signals 108 off die to the volatile storage die 103. Similarly, data output from the volatile storage die is transferred from the volatile storage die to the shared interface on the non-volatile storage die before being output onto the external data path 104. Note that if either of the two storage die transistor technologies is suited to implementation of logic circuitry such as that of the shared interface, then that die may alternatively be used to host the shared interface circuitry. Further, while the shared interface circuitry is generally described and shown as implemented on a distinct, dedicate shared-interface IC in the embodiments described below, in all such embodiments, the shared interface circuitry may be disposed on either a volatile memory die or non-volatile memory die. With respect to die orientation, the dice within the hybrid memory device may be disposed side-by-side, stacked over one another or, where there are more than two dice, disposed both in a side-by-side arrangement and stacked over one another (e.g., shared interface die disposed adjacent a stack of storage dice, or two or more separate stacks of storage dice). Also, various different three-dimensional (3D) packaging techniques may be used to interconnect the dice within the hybrid memory device including, for example and without limitation, die-to-die wire bonding, flip-chip-interconnect or wire-bond-interconnect through conductive structures in the package substrate, thru-silicon vias, flex-tape, die-in-substrate encapsulation, direct wafer bonding, proximity interconnect (e.g., inductively coupled or capacitively coupled interconnects), and so forth. In any of these variants, the hybrid memory device may include an encapsulating structure or other housing disposed over the interface die and storage die to form an integrated-circuit (IC) package.

Figure 2:
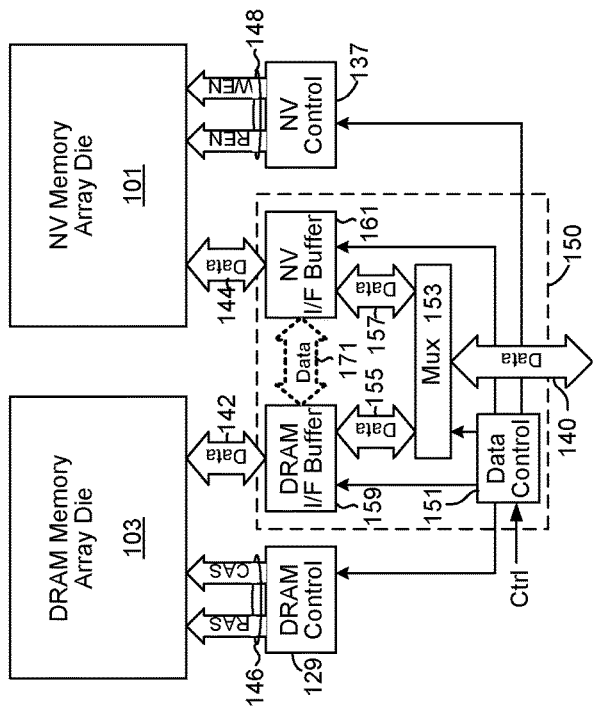
FIG. 2 illustrates an embodiment of a hybrid, composite memory device with the shared interface circuitry shown in greater detail and with the volatile and non-volatile memories being implemented by a DRAM memory die and Flash memory die, respectively.
Figure 4:
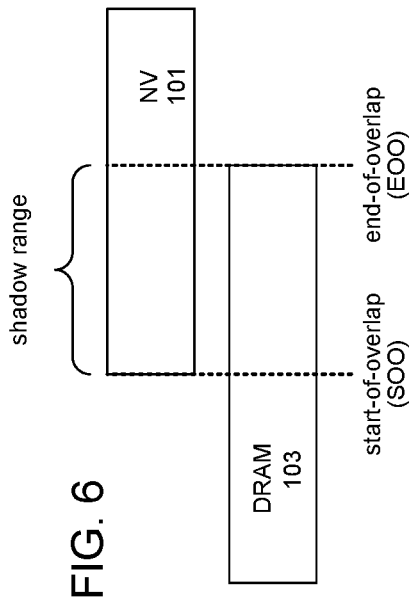
FIG. 4 illustrates an exemplary embodiment of an address comparator circuit that may be implemented within the command decoder of FIG. 2.

FIG. 2 illustrates an embodiment of a hybrid, composite memory device with the shared interface circuitry shown in greater detail and with the volatile and non-volatile memories being implemented by a DRAM die 103 and Flash memory die 101, respectively. As discussed, other types of volatile and non-volatile memories may be used. In the embodiment shown, the shared interface circuitry includes an external request interface 125, external data interface 133, command decoder 122, address queue 135, DRAM control circuit 129, Flash control circuit 137, and data control/steering circuit 131. In one embodiment, incoming control signals and addresses (collectively referred to herein as memory access requests or commands) are received in the external request interface 125 via control/address (CA) path 126, reformatted as necessary (e.g., deserialized to form a parallel command word and one or more address values) and then forwarded to the command decoder 122. The command decoder 122 in turn forwards address to the address queue 135 and stores memory access commands (read and write requests, at least, which may include more primitive commands such as activation commands, column access commands and precharge commands used to carry out memory accesses in the DRAM and, similar primitive commands for accessing a non-volatile storage) in an internal command queue. In one embodiment, referred to herein as the hybrid storage embodiment, non-overlapping address ranges apply to each of the storage dice 101 and 103 to form the overall addressable range of the composite memory device. By this arrangement, and by providing a comparator circuit within the command decoder 122 to determine whether the address component of a memory access command falls within the range of addresses allocated to the non-volatile or volatile storage, memory access operations may be automatically directed to either the volatile storage die or non-volatile storage die according to the memory address to be accessed. FIG. 4 illustrates an exemplary embodiment of an address comparator circuit that may be implemented within the command decoder of FIG. 2. As shown, the comparator circuit 181 compares the incoming address 178 with a predetermined (or programmatically established) memory address, NV-start 180, that marks the start of the non-volatile memory address range. In the embodiment shown, the non-volatile storage 101 is assumed to be mapped to the upper portion of the total device address range (in other embodiments, the lower portion could alternatively be used) so that, if the incoming address is greater than or equal to NV-start, the memory address falls within the non-volatile memory address range and the comparator outputs a memory select signal (MSel) 182 in a first logic state (e.g., logic '1') to enable access to the non-volatile memory die 101. If the incoming address is less than NV-start 180, the comparator outputs MSel 182 in a second logic state (e.g., logic '0') to enable access to the volatile memory die 103. Note that in the embodiment shown, the storage die selection may be signaled by the most significant bit of the incoming address (e.g., 0=DRAM, 1=Flash) or by some number of bits within the incoming address. In an alternative embodiment, a dedicated bit within the memory access request (other than an address bit) may be used to enable access to either the volatile storage die or non-volatile storage die.

Returning to FIG. 2, the command decoder 122 outputs, from the head of the command queue, an enable signal and corresponding memory access control signals to the DRAM control circuit 129 and NV control circuit 137. In one embodiment, each memory access is directed to either the DRAM die or the Flash memory die, though accesses may be overlapped at least in part to enable multiple accesses to the DRAM to be carried out while awaiting a memory read or programming operation (memory write) within the slower non-volatile die. Also, operations within either of the storage dice may be pipelined with other operations within that same storage die or with operations directed to the alternate storage die.

Considering a DRAM access first, when the DRAM control circuit 129 detects assertion of the DRAM enable signal, the DRAM control circuit 129 initiates a memory access operation within the DRAM storage die in accordance with the memory access command signaled by the command decoder 122. More specifically, in one embodiment, the command decoder 122 outputs DRAM primitive commands (activate, column access, precharge, refresh) to the DRAM control circuit which responds in turn by outputting row address strobe (RAS) and column-address-strobe (CAS) signals 146 to the DRAM storage die at the appropriate time to strobe row and column addresses (retrieved from the head of the address queue) into the DRAM memory array die 103 and thus initiate row activation, column access (i.e., memory read or memory write) and precharge operations. Similarly, when the NV control circuit 137 detects assertion of an NV-enable signal, the NV control circuit 137 initiates a memory access operation within the non-volatile storage die in accordance with the signaled memory access command. In the particular example shown in FIG. 2, for instance, the NV control circuit 137 asserts a read-enable signal or write-enable signal 148 according to the queued memory access command, to initiate a read or write memory access in the NV storage die at the location specified by the address queue.

The data control/steering circuit 131 is used to control the transfer of data between a shared internal data bus and dedicated internal data buses associated with the volatile and non-volatile storage dice, respectively. The shared internal data bus is coupled to the external data interface 133, which transfers read and write data between the shared internal data bus and external data path. The external data interface 133 may be a synchronous or asynchronous interface, and may perform a multiplexing function (sometimes referred to as a deserializing function) by converting a sequence of relatively narrow data words received at a relatively high frequency via the external data path 128, to a lower frequency, wider-data-word sequence on the primary internal data path 140, and performing the reverse operation (serializing) for data flow from primary internal data path 140 to external data path 128. In alternative embodiments, the external path may be wider and/or slower than the primary internal data path. Similarly, the data steering and control circuit 131 may perform a serializing/deserializing function for data transferred between the shared internal data path 140 and the volatile-die data path 142 and/or between the shared internal data path 140 and the non-volatile-die data path 144.

Figure 3:
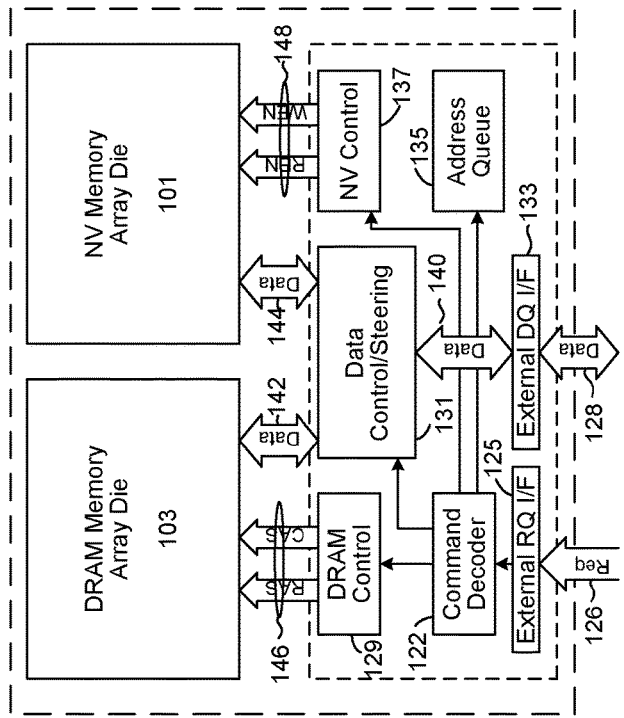
FIG. 3 illustrates an embodiment of a data control/steering circuit that may be used to implement the data control/steering circuit of FIG. 2, depicting exemplary interconnections with the DRAM and NV control circuits and also the volatile and non-volatile memory dice.

FIG. 3 illustrates an embodiment of a data control/steering circuit 150 that may be used to implement the data control/steering circuit 131 of FIG. 2, depicting exemplary interconnections with the DRAM and NV control circuits 129, 137 and also the volatile and non-volatile memory dice. As shown, the data control/steering circuit 150 includes data control circuit 151, multiplexer 153, secondary volatile and non-volatile data paths 155 and 157 (secondary as opposed to primary volatile and non-volatile data paths 142 and 144), volatile-storage-die interface buffer 159, non-volatile-storage-die interface buffer 161, and inter-die data path 171. The data control circuit 151 receives control signals from the command decoder that indicate the direction of data flow during a memory access operation (read or write) and whether the volatile or non-volatile storage die is the target of the memory access. In a memory write operation, data received via shared internal data path 140 is passed, via multiplexer 153, to one of the secondary data paths 155, 157 according to the memory access target (e.g., indicated by memory-select signal MSel as described in reference to FIG. 4). If the volatile storage die 103 is the target of the memory write, the data control circuit 151 switches the multiplexer 153 to convey data from the shared internal path 140 to secondary data path 155, and signals the DRAM interface buffer 159 to enable the data to be buffered (or queued) therein for eventual transfer to the DRAM die via data path 142. The data control circuit 151 issues a synchronizing signal to the DRAM control circuit 129 to enable generation of RAS and CAS signals 146 therein at a time that coincides with output of the corresponding write data from the DRAM interface buffer 159. Conversely, in a data read operation, the data control circuit 151 asserts a synchronizing signal to the DRAM control circuit 129 to initiate assertion of RAS and CAS signals 146 to enable data to be read out of the DRAM die from a specified address (e.g., supplied by the address queue of FIG. 2) and conveyed, via data path 142, to the DRAM interface buffer 159. Thereafter, the data is read out of the DRAM interface buffer 159 onto the secondary data path 155, and then passed through multiplexer 153 onto shared data path 140. As described above, the read data is conveyed via the shared data path 140 to external data interface 133 of FIG. 2, which includes one or more output driver circuits to output the data onto external data path 128. Alternatively, the data read out of the volatile storage die may be transferred from the volatile-die interface buffer 159 to the non-volatile-die interface buffer 161 via the inter-die data path 171. The transferred data may then be stored in the non-volatile storage die to implement a memory shadowing function as described below. Data may similarly be transferred in the opposite direction from the non-volatile die 101 to the volatile storage die 103 via inter-die data path 171 (i.e., transferring the data from buffer 161 to buffer 159), for example, to restore the state of the volatile storage die 103 to a pre-power-down or pre-sleep condition.

Data transfer between the shared internal data path 140 and the non-volatile storage die is fundamentally similar to that of the volatile data path. That is, in a memory write operation directed to the non-volatile storage die 101, the data control circuit 151 switches the multiplexer 153 to convey data from the shared internal path 140 to secondary data path 157 and signals the non-volatile-die interface buffer 161 to enable the data to be buffered (or queued) therein for eventual transfer to the non-volatile storage die via data path 144. The data control circuit 151 issues a synchronizing signal to the non-volatile control circuit 137 to enable generation of a write-enable signal (WEN) 148 therein at a time that coincides with output of the corresponding write data from the non-volatile-die interface buffer 161. Conversely, in a data read operation, the data control circuit 151 asserts a synchronizing signal to the non-volatile-die control circuit 137 to initiate assertion of a read-enable signal (REN) 148 to enable data to be read out of the non-volatile storage die from a specified address (e.g., supplied by the address queue of FIG. 2) and conveyed, via data path 144, to the non-volatile-die interface buffer 161. Thereafter, the data is read out of the non-volatile-die interface buffer 161 onto the secondary data path 157, and then passed through multiplexer 153 onto shared data path 140. As described above, the read data is conveyed via the shared data path 140 to external data interface 133 of FIG. 2, which includes one or more output driver circuits to output the data onto external data path 128.

Still referring to the embodiment of FIG. 3, the data control portion of the interface die manages the read and write and MUX-control commands to coordinate data transfers between the external data path and the volatile and non-volatile storage dice, as well as the die-to-die transfers. In some embodiments, this coordination will use parameters associated with relative access times and storage capacities of the two types of storage die. In some embodiments, these parameters may be programmatically controlled. In addition to access time and storage capacity parameters, some embodiments may also include a minimum transfer size parameter, as the non-volatile memory die and the volatile memory die may have different access granularities. For example, a NAND-type non-volatile Flash memory may have a 4 kB (32768 bits) "page size" that is the minimum amount of data that may be read or written during a given transaction. In contrast, a NOR-type non-volatile Flash or a volatile DRAM memory device may have a much smaller minimum: for example, 32 bits. The minimum transfer size parameter may be chosen to be the larger of the two minimums. In the above example, for instance, a minimum of 4 kB of data may transferred between the volatile and non-volatile storage dice during any transfer operation.

Shadow Operation

In hybrid memory architectures described so far, the volatile and non-volatile storage devices have been assumed to have non-overlapping address ranges. In alternative embodiments, including production-time or run-time configurable embodiments, some or all of the volatile memory address range may overlap with the non-volatile memory address range to enable an operation referred to herein as memory shadowing. In memory shadowing, memory accesses are directed first to the non-volatile storage device to enable relatively high-speed, non-degrading memory accesses, with the data eventually being written-back (retired or recorded) within the non-volatile storage in response to a triggering event referred to herein as a write-back trigger. Applications of memory shadowing include non-volatile DRAM, and rapid-access non-volatile memory.

Figure 5:
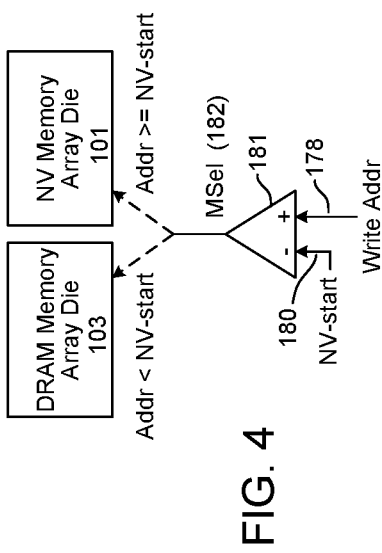
FIG. 5 illustrates an exemplary memory shadowing operation.

FIG. 5 illustrates an exemplary memory shadowing operation. Initially, at (A), data is stored in a fast-access volatile storage die at a specified address (indicated by location 203), and a write-back table within the volatile storage die is updated. As shown at 201 the write-back table may include a start address, end address and entry-valid bit (V) for entries stored in respective rows of the table (e.g., entry 0, entry 1, entry 2, etc. as indicated by the subscripted start address, end address and entry-valid bits). Note that the write-back table may be maintained in a location other than the volatile storage die (or at least outside the volatile storage array), such as in an SRAM memory buffer or other memory element within the shared interface circuitry. Some time after one or more data write operations have been performed, a write-back trigger is detected within the shared interface circuitry and, in response, one or more internal data transfer operations are performed to transfer data from the locations indicated by the write-back table to be dirty (i.e., updated within the volatile storage die relative to the same-address contents of the non-volatile storage die, as shown by location 203) from the DRAM to corresponding locations (e.g., 205) within the NV memory. After the write-back operations are complete, the corresponding entry-valid bits for the now-coherent data storage (i.e., same-valued data in both the volatile and non-volatile storage devices) are reset or otherwise cleared to indicate that those entries are no longer valid. In one embodiment, the overlapping regions of non-volatile and volatile memory share the same physical addresses within their respective storage die, so the memory shadowing operation involves transferring data from dirty locations within the volatile storage die to like locations within the non-volatile storage die. Alternatively, address translation may be performed to correlate entries within the non-volatile storage die to counterpart entries within the volatile storage die.

The write-back trigger itself may include any number or combination of stimuli, including detecting that the write-back table has a threshold number of valid entries; periodically performing write-back (e.g., after every so many writes to the non-volatile storage and/or after a predetermined or configurable amount of time has elapsed); detecting a power-loss or power-down signal or event (i.e., performing all necessary write-backs—an operation referred to herein as flushing the write-back table—as part of power down), receiving an explicit command to flush the write-back table or otherwise perform one or more write-back operations and so forth.

Still referring to FIG. 5, although the write-back table is depicted as defining, in each table entry (or row), a memory range bounded by a start and end address, the memory range may alternatively be fixed and thus denoted only by a start address. Also, a start address or end address and run-length value may be used to define the memory range. Further, the entry-valid bit may be omitted, with identical start end-addresses or end-address<start address used to denote invalid or unused table entries. Also, a new entry within the write-back table is not required for each write to the volatile storage device. For example, the control circuit may determine that the memory locations updated in a given write operation are already encompassed by an entry within the write-back table (and thus already marked as dirty) or that the updated memory locations are near enough to a dirty region defined within a write-back table entry such that the start address and/or end address of the entry may be modified to extend the dirty region to include the newly updated locations.

Figure 6:
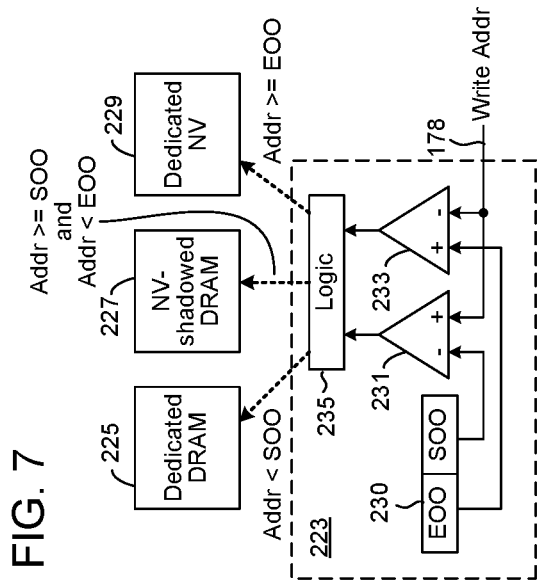
FIG. 6 illustrates the general nature of a configurable overlapping address range between the volatile storage die (DRAM in this example) and non-volatile storage die.

FIG. 6 illustrates the general nature of a configurable overlapping address range between the volatile storage die 103 (DRAM in this example) and non-volatile storage die 101. As shown, a start-of-overlap address (SOO) represents the lowest address within the shadowed memory space (i.e., overlapped address range), and an end-of-overlap address (EOO) represents the highest address within the shadowed memory space. In alternative embodiments, the total size of the shadowed memory space may be fixed so that only the end-of-overlap or start-of-overlap addresses need be explicitly provided, with the unspecified bound arithmetically determinable. Addresses below the start-of-overlap define a dedicated volatile-storage region within the hybrid memory device, and addresses above the end-of-overlap define a dedicated non-volatile region within the hybrid memory device. In the event that the volatile and non-volatile storage die have matching capacity, the shadowed memory space may be configured to consume the entire storage space of both devices by setting the start-of-overlap address and end-of-overlap address to the minimum and maximum address values, respectively, of the capacity of either storage die. Also, in some embodiments, the start-of-overlap and/or end-of-overlap values may be reprogrammed during the course of normal operation of the hybrid memory device (i.e., configuration of the device need not limited to a one-time initialization).

Figure 7:
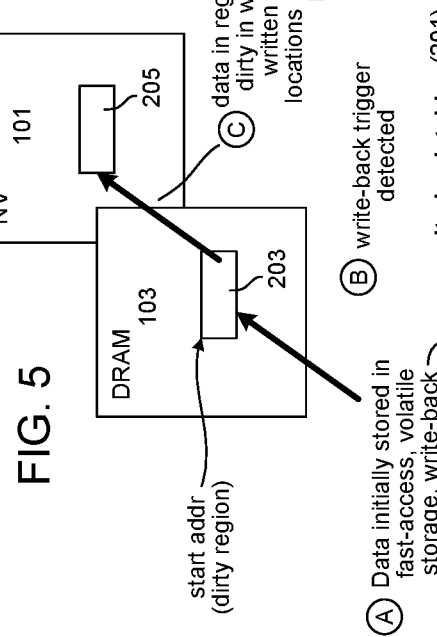
FIG. 7 illustrates an embodiment of an address comparator circuit that may be used to determine whether a memory access is directed to the dedicated volatile storage, dedicated non-volatile storage, or shadowed memory space within a configurable-overlap, hybrid memory device.

FIG. 7 illustrates an embodiment of an address comparator circuit 223 that may be used to determine whether a memory access is directed to the dedicated volatile storage, dedicated non-volatile storage, or shadowed memory space within a configurable-overlap, hybrid memory device. As shown, the address comparator circuit includes a run-time or production-time programmable register 230 to hold start-of-overlap (SOO) and end-of-overlap (EOO) address values (i.e., the register 230 may be loaded in response to host instruction with host-supplied start-of-overlap and end-of-overlap address values), a pair of comparators 231 and 233, and a logic circuit 235 to enable access to either the volatile storage 225, non-volatile storage 229, or shadowed memory space 227, according to the output of the comparators 231 and 233. In the embodiment shown, an incoming write address 178 is supplied to the '+' input of comparator 231 and the '−' input of comparator 233, with the '−' input of comparator 231 coupled to receive the start-of-overlap address from register 230, and the '+' input of comparator 233 coupled to receive the end-of-overlap address from register 230. By this arrangement, comparator 231 will output a logic high or low comparison result state according to whether the incoming write address is exceeds (or is equal to) the start-of-overlap address, and comparator 233 will similarly output a logic high or low comparison result according to whether the write address exceeds (or is equal to) the end-of-overlap address. Thus, if both the comparison results are in a first logic state (indicating that write address >=SOO and write address <=EOO), the logic circuit 235 will output a signal indicating that a shadowed memory operation is to take place, including updating the write-back table as necessary (i.e., as described in reference to FIG. 5). By contrast, if the comparison results indicate that the write address is less than the start-of-overlap address or greater than the end-of-overlap address, the logic circuit 235 may issue enable signals to the corresponding volatile-storage control circuitry or non-volatile storage control circuitry to enable access to the dedicated volatile storage or non-volatile storage regions therein.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A memory, comprising:
   a dynamic random access memory (DRAM) storage die having an array of volatile storage cells;
   a second storage die that is separate from the DRAM storage die and having an array of non-volatile storage cells; and
   interface circuitry shared by the DRAM storage die and the second storage die, the interface circuitry to receive information associated with a memory access operation to be performed within the memory, the information specifying an access to either the DRAM storage die or the second storage die.

2. The memory of claim 1, wherein the information associated with the memory access operation comprises an address value, and wherein the interface circuitry comprises a circuit to select, according to one or more bits of the address value, either the DRAM storage die or the second storage die to be accessed in the memory access operation.

3. The memory of claim 1, wherein the information associated with the memory access operation comprises a memory access command that indicates the memory access operation to be performed and which of the DRAM storage die and second storage die is to be accessed in the memory access operation, and wherein the interface circuitry comprises a circuit to select, according to one or more bits of the memory access command, either the DRAM storage die or the second storage die to be accessed in the memory access operation.

4. The memory of claim 1, wherein the interface circuitry comprises circuitry to receive memory access commands directed to the DRAM storage die and the second storage die and to convey read and write data between an external data path and the DRAM storage die and the second storage die in response to the memory access commands.

5. The memory of claim 1, wherein the interface circuitry is disposed within a third die.

6. The memory of claim 1, wherein the interface circuitry is formed at least in part on at least one of the DRAM storage die and the second storage die.

7. The memory of claim 1, wherein the second storage die is a Flash memory die comprising an array of Flash memory cells.

8. The memory of claim 1, further comprising a programmable register to indicate a range of address values that are common between the array of volatile storage cells and the array of non-volatile storage cells.

9. The memory of claim 1, wherein the information associated with the memory access operation comprises an input address value, and wherein the interface circuitry comprises a comparator circuit to compare the input address value with an address value that indicates a start address within either the DRAM storage die or the second storage die.

10. The memory of claim 9, wherein the comparator circuit generates a comparison result that indicates whether the input address value falls within an address range of the DRAM storage die or an address range of the second storage die.

11. The memory of claim 10, wherein the memory access operation is carried out within the DRAM storage die if the comparison result indicates that the input address value falls within the address range of the first storage die, and within the second storage die if the comparison result indicates that the input address value falls within the address range of the second storage die.

12. A method of operation in a memory, the memory including a DRAM storage die having an array of volatile storage cells, a second storage die that is separate from the DRAM storage die and having an array of non-volatile storage cells, and interface circuitry shared by the DRAM storage die and the second storage die, the method comprising:
    receiving, with the interface circuitry, information associated with a memory access operation; and
    performing the memory access operation within the memory based on the information, the information specifying an access to either the DRAM storage die or the second storage die.

13. The method of claim 12, wherein the information comprises an address value, and wherein performing the memory access operation within the memory comprises performing the memory access operation within either the DRAM storage die or the second storage die according to one or more bits within the address value.

14. The method of claim 13, wherein performing the memory access operation within either the DRAM storage die or the second storage die according to one or more bits within the address value comprises performing the memory access operation within either the DRAM storage die or the second storage die according to whether the address value falls within an address range of the DRAM storage die or an address range of the second storage die.

15. The method of claim 12, wherein the information comprises a memory access command that indicates which of the DRAM storage die and the second storage die is to be accessed in the memory access operation and wherein performing the memory access operation within the memory comprises performing the memory access within either the DRAM storage die or the second storage die according to one or more bits within the memory access command.

16. The method of claim 12 wherein the second IC storage die is a Flash memory die comprising an array of Flash memory cells.

17. A memory, comprising:
- multiple DRAM storage dice, each of the multiple DRAM storage dice having an array of volatile storage cells;
- at least one non-volatile storage die having an array of non-volatile storage cells; and
- interface circuitry shared by the multiple DRAM storage dice and the at least one non-volatile storage die, the interface circuitry, during a normal mode of operation, to receive information associated with a memory access operation to be performed within the memory, the information specifying an access to either one of the multiple DRAM storage dice or the at least one non-volatile storage die.

* * * * *